United States Patent
Shim et al.

(10) Patent No.: US 6,989,664 B2
(45) Date of Patent: Jan. 24, 2006

(54) RF POWER SENSOR FOR MEASURING AN RF SIGNAL POWER USING CAPACITANCE

(75) Inventors: Dong-ha Shim, Seoul (KR); In-sang Song, Seoul (KR); Young-il Kim, Ansan (JP); Sun-hee Park, Yongin (KR); Young-tack Hong, Suwon (KR); Dong-ki Min, Suwon (KR)

(73) Assignee: Samsung Electonics Co., Ltd., Suwon (KR)

( * ) Notice: Subject to any disclaimer, the term of this patent is extended or adjusted under 35 U.S.C. 154(b) by 180 days.

(21) Appl. No.: 10/408,779

(22) Filed: Apr. 8, 2003

(65) Prior Publication Data

US 2003/0214309 A1 Nov. 20, 2003

(30) Foreign Application Priority Data

Apr. 16, 2002 (KR) ................. 10-2002-0020554

(51) Int. Cl.
 *G01R 31/00* (2006.01)
 *G01R 29/24* (2006.01)
 *G01R 27/26* (2006.01)

(52) U.S. Cl. .................... 324/96; 324/109; 324/690
(58) Field of Classification Search .............. 324/95, 324/96, 109, 103 R, 103 P, 632, 658, 686, 324/690, 661, 662; 250/336.1
See application file for complete search history.

(56) References Cited

U.S. PATENT DOCUMENTS

| | | | | |
|---|---|---|---|---|
| 4,789,823 A | | 12/1988 | Delfs et al. ................ 324/95 |
| 5,055,889 A | * | 10/1991 | Beall ......................... 257/277 |
| 5,070,241 A | * | 12/1991 | Jack .......................... 250/336.2 |
| 5,204,614 A | * | 4/1993 | Szente et al. .................. 324/95 |
| 5,467,013 A | * | 11/1995 | Williams et al. ............. 324/127 |
| 5,517,123 A | * | 5/1996 | Zhao et al. .................. 324/458 |
| 5,912,560 A | * | 6/1999 | Pasternak .................... 324/536 |
| 6,081,700 A | * | 6/2000 | Salvi et al. ............... 455/193.3 |
| 6,380,600 B1 | * | 4/2002 | Alping et al. ................ 257/415 |
| 6,670,864 B2 | * | 12/2003 | Hyvonen et al. .............. 333/32 |
| 6,741,070 B2 | * | 5/2004 | Kodato ......................... 324/95 |
| 6,744,335 B2 | * | 6/2004 | Ryhanen et al. ............. 333/185 |
| 6,765,394 B1 | * | 7/2004 | Igel et al. .................... 324/661 |
| 6,788,175 B1 | * | 9/2004 | Prophet ........................ 335/78 |
| 6,803,774 B2 | * | 10/2004 | Park ............................ 324/661 |

OTHER PUBLICATIONS

De Coster et al. (Variable RF MEMS capacitors with extended tuning range. TRANSDUCERS, Solid–State Sensors, Actuators and Microsystems, 12th International Conference on, 2003, vol.: 2, Jun. 8–12, 2003 pp.: 1784–1787 vol. 2).*

* cited by examiner

*Primary Examiner*—Anjan Deb

(57) ABSTRACT

An RF power sensor for measuring power for an RF signal using capacitance includes a substrate preferably formed of a semiconductor, such as silicon or of a dielectric substance, a fixture part fixed to the substrate and forming a signal line and ground lines that transmit RF signals, and a bridge connected to the ground lines and floating over the signal line, wherein the bridge is driven by an external driving force, and the external driving force induces capacitance between the bridge and the signal line. Accordingly, power for an RF signal can be measured through the capacitance between the signal line and the bridge. The RF power sensor facilitates matchings, reduces insertion loss, and can be used in a wide bandwidth because it is based on transmission lines having characteristic impedance. Further, high power can be measured depending upon bridge designs.

10 Claims, 3 Drawing Sheets

RF POWER SENSOR FOR MEASURING AN RF SIGNAL POWER USING CAPACITANCE

BACKGROUND OF THE INVENTION

1. Field of the Invention

The present invention relates to an RF power sensor fabricated in a Micro Electro Mechanical System (MEMS). More particularly, the present invention relates to an RF power sensor capable of measuring an RF signal power using capacitance.

2. Description of the Related Art

Micro Electro Mechanical System (MEMS) is a technology for implementing mechanical parts into electrical devices using a semiconductor process. Each device, which has a mechanical structure and operates accordingly, is manufactured through a semiconductor manufacturing process on a semiconductor wafer.

Precise power measurement is essential for high quality connections in communications systems. In general, terminals or base stations transmit power to an extent that signals reach a target. However, power transmissions above that which are necessary cause unnecessarily high power consumptions and are restricted by regulations regarding maximum allowable transmission values. Therefore, a possible solution to the above problem includes using a power sensor to precisely measure RF power.

In general, there are two types of sensors used for RF power measurements. A first type is a rectification-type sensor (rectifier) and a second type is a thermal-type sensor (thermal detector).

A rectification-type sensor uses a frequency down-conversion process converting a high frequency to a low frequency through characteristics of a non-linear device, such as a diode, to take RF power measurements.

A thermal-type sensor uses resistance changes or dielectric permittivity changes due to temperature changes to take RF power measurements. In addition, there are several types of thermal-type sensors. A thermal-type sensor may be a thermistor, a thermocouple sensor, or the like. Unlike the rectification-type sensor, the thermal-type sensor has an advantage of easy measurements due to the absence of super high frequency characteristics of a detection signal. Another advantage of the thermal-type sensor is that cooling is not necessary due to the operation capability at room temperature with a simple interface.

The power sensor of a thermistor uses resistance changes of the thermistor capable of sensing temperature changes of an endmost load based on RF power to calculate an input power. The thermistor changes a resistance value thereof as a temperature thereof changes. The relation between the resistance and power of the thermistor is non-linear and different depending upon devices for which the thermistor is used so that the thermistor is used in a self-balancing bridge circuit. The sensor of the thermistor has a relatively high degree of precision and may be used in association with other sensors.

The dynamic range, however, is restricted to a range from about −10 dBm to −20 dBm, the values of which indicate a relatively narrow range in comparison to the present RF technology standard. Further, the thermistor is not widely used since, as a practical matter, the thermistor does not meet requirements for digital communications due to a slow response speed caused by the use of temperature changes.

Further, the power sensor of a thermocouple is appropriate for measurements of diverse kinds of RF power up to complicated digital phase modulation signals due to the capability of responses to real power.

The thermocouple power sensor produces a small voltage due to a voltage difference between two kinds of metals having a temperature difference. That is, the thermocouple power sensor generates a small voltage difference so that a plurality of thermocouples connected together in series are used to form a thermopile. The thermopile produces a much larger output to enable an electric current sensing circuit to be simply structured. A dynamic range of the thermocouple power sensor is from −30 dBm to +20 dBm, a wide bandwidth of 20 GHz, and of excellent sensitivity. However, a thermocouple power sensor has a drawback to response speeds as slow as a few msec as in the thermistor power sensor.

In the meantime, a diode power sensor rectifies RF energy to produce a DC voltage without measurements of heat generated from an RF signal. The diode power sensor has good sensitivity compared to other kinds of sensors and a wide dynamic range from −70 dBm to −20 dBm. Further, the diode power sensor has a wide bandwidth of 40 GHz and response speeds as fast as a few $\mu$sec. Therefore, the diode power sensor is appropriate for the Time Division Multiple Access (TDMA) method, which requires fast response characteristics.

However, in a case of the diode power sensor, terms of high order are increased for power over −20 dBm so that non-linear characteristics occur.

In the meantime, in a case of the diode power sensor, there are two methods for measuring power over +20 dBm. The first method is to place an attenuator in the stage prior to a diode, which has a drawback of deteriorating the degree of precision of a power sensor. The second method is to calibrate a signal for use, which uses the diode calibration and digital signal processing (DSP) so that it has a drawback of a high cost.

As above, the conventional power sensors have problems in that the characteristic impedances thereof change based on temperature changes, which causes difficulties in matchings and deteriorates measurement precision degrees since they need couplers, attenuators, and the like.

SUMMARY OF THE INVENTION

In an effort to solve the above problems, it is a feature of an embodiment of the present invention to provide an RF power sensor for measuring RF power through a varied amount of capacitance caused by an electromagnetic force between a signal line and a bridge formed on a substrate.

In order to provide the above feature, an RF power sensor according to the present invention includes a substrate, a fixture part fixed to the substrate and forming a signal line and ground lines for transmitting RF signals, and a bridge connected to the ground lines and floating over the signal line, wherein the bridge is driven by an external driving force and the external driving force induces capacitance between the bridge and the signal line.

Preferably, the substrate is formed of a semiconductor, such as silicon (Si), or of a dielectric substance.

Preferably, the RF power sensor further includes a power measurement part for detecting the capacitance between the bridge and the signal line and measuring power for the RF signals, and an RF cutoff part for cutting off the RF signals transmitted through the signal line to the power measurement part.

Preferably, the RF cutoff part includes a first and a second inductor for blocking an RF signal transmitted through the signal line so the RF signal is not transferred to the capacitance detector.

The power measurement part preferably includes a capacitance detector for detecting the capacitance occurring between the bridge and the signal line; and a power calculator for calculating power for the RF signals depending upon a detection result of the capacitance detector.

Preferably, the bridge is vertically formed having a predetermined thickness with respect to the signal line.

The present invention provides easy matchings and less insertion loss since the present invention is based on a signal line and a ground line formed on a semiconductor substrate. Further, the present invention increases the degree of precision of power measurements since no additional devices such as couplers, attenuators, and the like, are required for the power measurements due to the capability of the present invention to be disposed in a series on a circuit.

BRIEF DESCRIPTION OF THE DRAWINGS

The above and other features and advantages of the present invention will become readily apparent to those of ordinary skill in the art by review of the following detailed description of preferred embodiments thereof with reference to the attached drawings in which.

DETAILED DESCRIPTION OF THE INVENTION

Korean Patent Application No. 2002-20554, filed Apr. 16, 2002, and entitled: "RF Power Sensor for Measuring RF Signal Power Through Capacitance," is incorporated by reference herein in its entirety.

Hereinafter, the present invention is described in detail with reference to the accompanying drawings.

Figure 1:
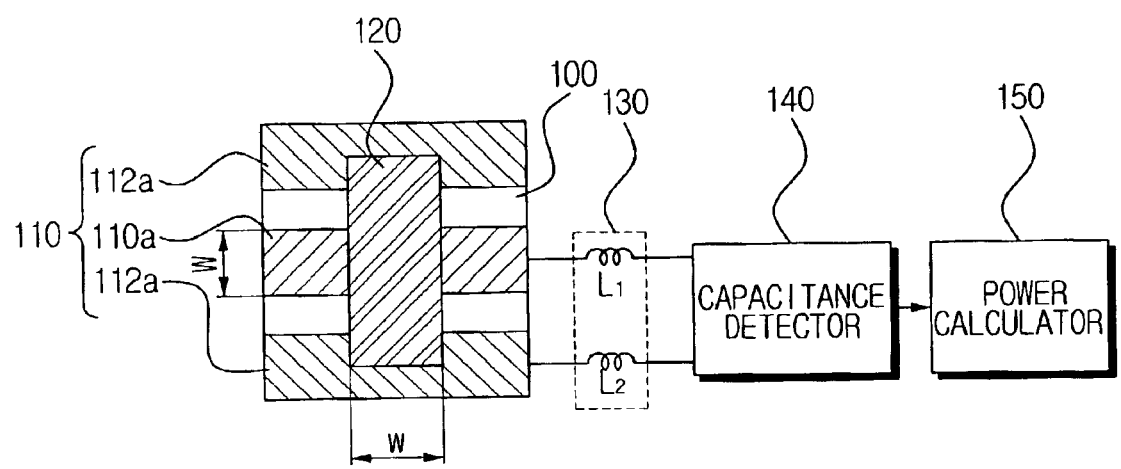
FIG. 1 illustrates a view showing a structure of an RF power sensor according to an embodiment of the present invention.
Figure 2:
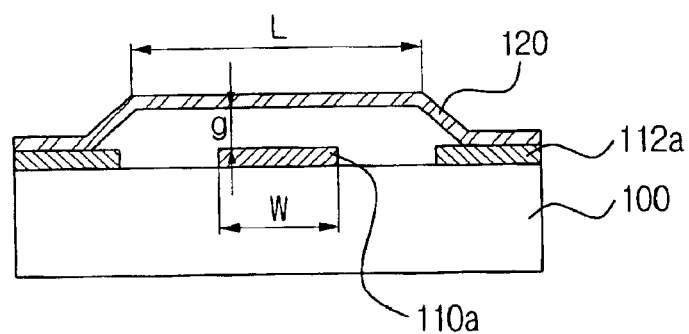
FIG. 2 illustrates a view showing a cross-section of a MEMS device according to an embodiment of the present invention.

FIG. 1 illustrates a view showing a structure of an RF power sensor according to an embodiment of the present invention. FIG. 2 illustrates a view showing a cross-section of a MEMS device according to an embodiment of the present invention.

Referring to FIG. 1 and FIG. 2, an RF power sensor according to the present invention has a substrate 100, a fixture part 110 fixed to the substrate 100 on an upper side of the substrate 100 for forming a ground line 112a and a signal line 110a transmitting an RF signal, a bridge 120 connected to the ground line 112a and floating over the signal line 110a, an RF cutoff part 130 for cutting off an RF signal, a capacitance detector 140 for detecting capacitance occurring by an electromagnetic force between the signal line 110a and the bridge 120, and a power calculator 150 for calculating electric power for an RF signal using a detected capacitance.

The RF cutoff part 130 is generally formed with a first and a second inductor $L_1$ and $L_2$, for blocking an RF signal transmitted through the signal line 110a so the RF signal is not transferred to the capacitance detector 140.

The substrate 100 is preferably formed of a semiconductor, such as silicon (Si), or of a dielectric substance.

The bridge 120 is connected to the ground line 112a fixed to the substrate 100 and floats over the signal line 110a by a predetermined distance. Further, the bridge 120 is driven by an external electromagnetic force, and capacitance of a predetermined magnitude is caused between the bridge 120 and the signal line 110a by the external electromagnetic force.

The bridge 120 has a certain thickness, and capacitance induced by an electromagnetic force varies depending upon the thickness. The variations of capacitance result from a difference between a bending extent of the bridge 120 of 10 µm in thickness due to an RF signal and a bending extent of the bridge 120 of 5 µm in thickness due to an external electromagnetic force. That is, induced capacitance varies depending upon the thickness of the bridge 120 with respect to an electromagnetic force generated by the same RF signal. Therefore, it is possible to measure high power depending upon the design of the bridge 120.

If the bridge 120 is displaced by an electromagnetic force occurring by an RF signal, the displacement is determined by an electromagnetic force and spring constant k of the bridge 120. That is, the variations in a distance g between the signal line 110a and the bridge 120 are determined by an electromagnetic force and a spring constant k of the bridge 120. Accordingly, a measured power is the same even though an identical RF signal induces a different capacitance with a different thickness of the bridge 120.

If a predetermined capacitance is induced by an external electromagnetic force between the bridge 120 and the signal line 110a, the capacitance detector 140 detects the capacitance induced by the external electromagnetic force. The capacitance detector 140 detects capacitance based on a predetermined distance g between the bridge 120 and the signal line 110a and the variations in a distance g between the bridge 120 and the signal line 110a that occur due to an electromagnetic force.

If capacitance between the bridge 120 and the signal line 110a is detected by the capacitance detector 140, the power calculator 150 calculates power for an RF signal using the detected capacitance. The power calculator 150 calculates power for an RF signal based on the following Formula 1.

$$P_{RF} = \frac{2k}{\varepsilon_0 w W Z_0} \Delta (g - \Delta)^2 \approx \frac{2kg^2}{\varepsilon_0 w W Z_0} \Delta \quad (1)$$

In Formula 1, k denotes a spring constant of the bridge 120, $\varepsilon_0$ denotes dielectric permittivity, w denotes a width of the bridge 120, W denotes a width of the signal line 110a, $Z_0$ denotes characteristic impedance, g denotes a distance between the signal line 110a and the bridge 120, and Δ denotes a variation of g due to an external electromagnetic force.

Power for an RF signal which is calculated in the power calculator 150 varies depending upon the capacitance detected by the capacitance detector 140. Further, capacitance is determined by an external electromagnetic force. That is, if power for an RF signal varies, capacitance varies due to the variation of a distance g between the signal line 110a and the bridge 120.

The displacement Δ of the bridge 120 occurs due to an electromagnetic force caused by an RF signal, and, at this time, the displacement Δ is determined by the electromagnetic force and a spring constant k of the bridge 120. The spring constant k of the bridge 120 is determined by a thickness t, length L, width w, and Young's modulus of the bridge 120.

Further, capacitance C is calculated based on following Formula 2.

$$C = \frac{\varepsilon_0 A}{g} \quad (2)$$

In Formula 2, $\varepsilon_0$ denotes a dielectric permittivity, A denotes an area of the signal line 110a, and g denotes a distance between the signal line 110a and the bridge 120. From Formula 2, it may be seen that capacitance between the signal line 110a and the bridge 120 increases as a distance g between the signal line 110a and the bridge 120 decreases due to an electrostatic force caused by an RF signal.

Figure 3:
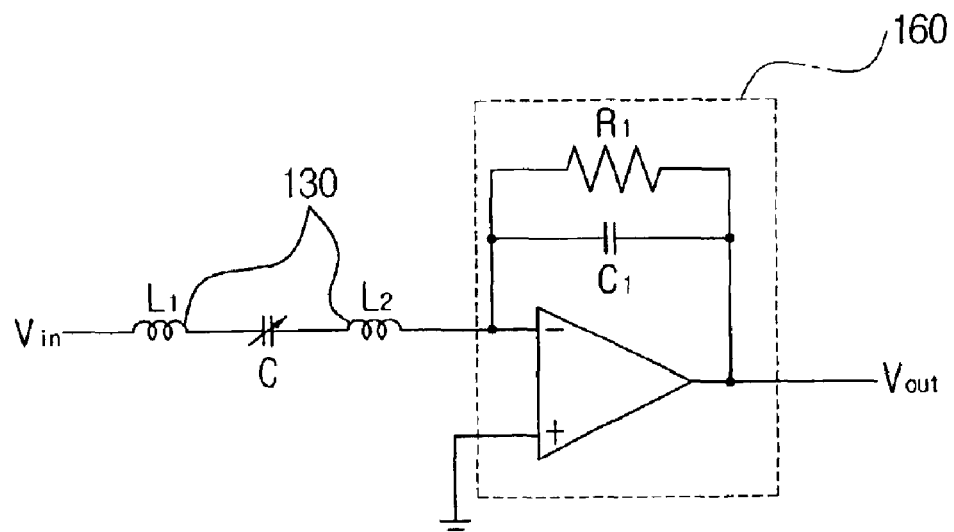
FIG. 3 is a circuit of the RF power sensor of FIG. 1.

FIG. 3 is a circuit of the RF power sensor of FIG. 1.

Referring to FIG. 3, the RF power sensor includes an RF cut off part 130 including a first and a second inductor $L_1$ and $L_2$ for playing roles of restricting the transfer of an RF signal to the capacitance detector 140 in order to transmit the RF signal only through the signal line 110a, a variable capacitor C indicating capacitance between the signal line 110a and the bridge 120 depending upon changes to the power of the RF signal, and a charge pump 160 including a resistor $R_1$, a capacitor $C_1$, and an operational amplifier.

A signal outputted through the charge pump 160 is converted into a frequency signal by a demodulator (not shown). The charge pump 160 indicating a structure of a circuit of the capacitance detector 140 senses the changes to capacitance, that is, the changes to the variable capacitor C, to detect capacitance. The capacitance detected from the capacitance detector 140 indicates power for an RF signal.

Figure 4A:
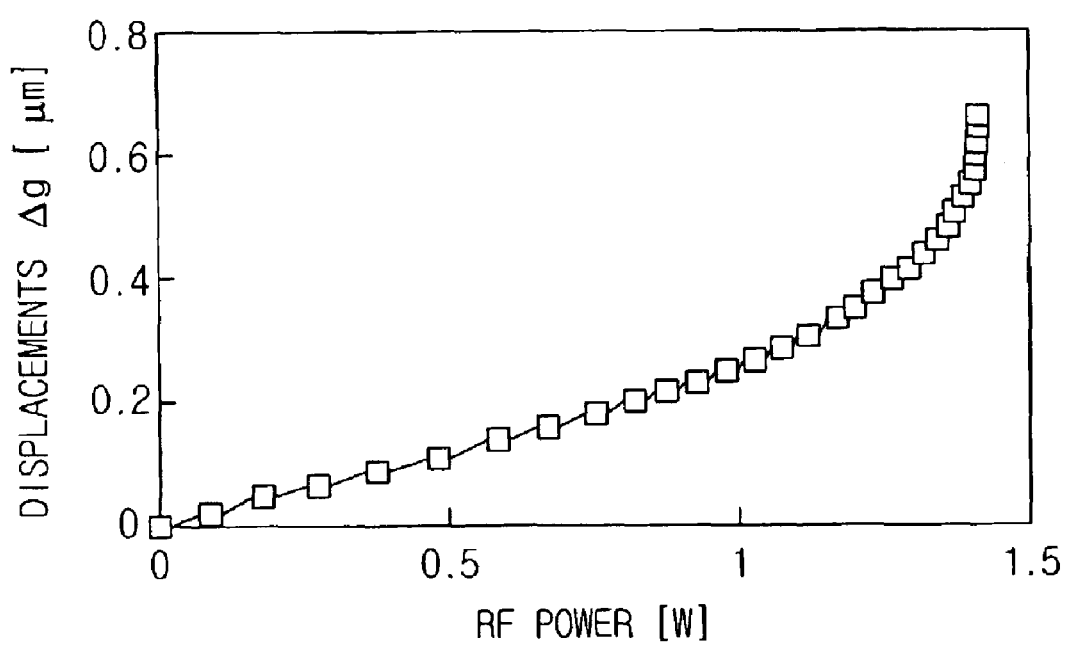
FIG. 4A is a graph showing a relation between variations of a distance between a bridge and a signal line g and RF power.
Figure 4B:
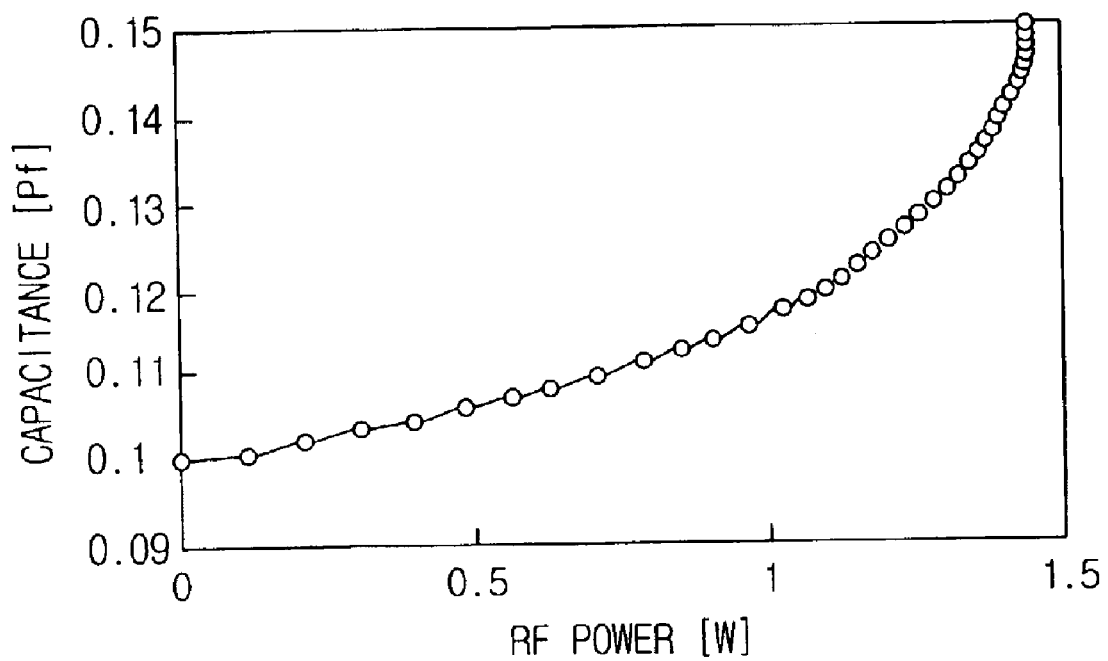
FIG. 4B is a graph showing a relation between a capacitance and RF power.

FIG. 4A is a graph showing a relation between RF power and a distance between a bridge and a signal line. FIG. 4B is a graph showing a relation between RF power and capacitance between the bridge and the signal line.

As shown in FIGS. 4A and 4B, as an RF signal power varies, capacitance varies with changes in a distance g between the signal line 110a and the bridge 120. That is, if a change in the distance g between the signal line 110a and the bridge 120 due to an external driving force is known, capacitance between the signal line 110a and the bridge 120 may be calculated, and, thus, an RF signal power may be obtained using the calculated capacitance.

As shown in FIG. 2 of the present embodiment, even though descriptions of a preferred embodiment have been provided wherein RF signal transmission lines are formed on a semiconductor substrate with a pair of ground lines 112a and a signal line 110a between the ground lines 112a, the present invention is not limited to this preferred embodiment, but may be applied to all structures formed with a signal line 110a and ground lines 112a that can transmit RF signals. Further, the bridge 120 is connected to the ground lines 112a and formed in a structure floating over the signal line 110a, so that it may be applied to the entire structure, which can induce predetermined capacitance between the signal line 110a and the ground lines 112a due to an external driving force.

The present invention facilitates characteristic impedance matchings, reduces an insertion loss, and can be used in a wide bandwidth because it is based on a signal line and ground lines formed on a semiconductor substrate and manufactured using MEMS technology. Further, the present invention reduces power loss and increases the degree of precision of power measurements due to the absence of additional devices, such as couplers, attenuators, or the like, typically required for measuring power since the present invention can be disposed in series together with other circuits. Furthermore, the power can be measured with respect to RF signals having high power depending on the design of the bridge.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An RF power sensor, comprising:
    a substrate;
    a fixture part fixed to the substrate and forming a signal line and ground lines for transmitting RF signals; and
    a bridge connected to the ground lines and floating over the signal line, wherein the bridge is deflected by an external driving force generated from the RF signals and the external driving force induces capacitance between the bridge and the signal line.

2. The RF power sensor as claimed in claim 1, wherein the substrate is formed of a semiconductor, such as silicon (Si), or of a dielectric substance.

3. The RF power sensor as claimed in claim 1, further comprising:
    a power measurement part for detecting the capacitance between the bridge and the signal line and measuring power for the RF signals; and
    an RF cutoff part for cutting off the RF signals transmitted through the signal line to the power measurement part.

4. The RF power sensor as claimed in claim 3, wherein the power measurement part comprises:
    a capacitance detector for detecting the capacitance occurring between the bridge and the signal line; and
    a power calculator for calculating power for the RF signals depending upon a detection result of the capacitance detector.

5. The RF power sensor as claimed in claim 4, wherein the RF cutoff part comprises:
    a first and a second inductor for blocking an RF signal transmitted through the signal line so the RF signal is not transferred to the capacitance detector.

6. The RF power sensor as claimed in claim 1, wherein the bridge is vertically formed having a predetermined thickness with respect to the signal line.

7. An RF power sensor, comprising:
    a circuit having a variable capacitance that is induced by an electromagnetic force generated from RF signals; and
    a calculator that calculates a power of the RF signals based on the variable capacitance induced by the RF signal, wherein the calculator includes a charge pump and a set of inductors configured to restrict transfer of the RF signals from the circuit to the charge pump.

8. An RF power sensor, comprising:
    a circuit having a variable capacitance that is induced by an electromagnetic force generated from RF signals, wherein the circuit includes;

a ground line, a signal line carrying the RF signals, and a bridge coupled to the ground line and configured to displace relative to the signal line in response to electromagnetic forces generated from the RF signals to produce the variable capacitance; and a calculator that calculates a power of the RF signals based on the variable capacitance induced by the RF signals.

9. The RF power sensor as claimed in claim 8, wherein the variable capacitance is based on an area of the signal line, a distance between the signal line and the ground line, and a dielectric permittivity.

10. The RF power sensor as claimed in claim 8, wherein the calculator calculates the power of the RF signals based on a spring constant of the bridge, a dielectric permittivity, a width of the bridge, a width of the signal line, and a distance between the signal line and the ground line.

* * * * *